United States Patent [19]

Bakker

[11] Patent Number: 4,767,984
[45] Date of Patent: Aug. 30, 1988

[54] PROTECTIVE FIXTURE FOR CHIP CARRIER

[75] Inventor: Roel J. Bakker, York, Pa.

[73] Assignee: AMP Incorporated, Harrisburg, Pa.

[21] Appl. No.: 139,173

[22] Filed: Dec. 21, 1987

Related U.S. Application Data

[63] Continuation of Ser. No. 784,917, Oct. 4, 1985, abandoned.

[51] Int. Cl.$^4$ ............... G01R 31/02; B23P 19/00; B65D 85/30
[52] U.S. Cl. .................. 324/158 F; 29/760; 206/329; 269/117; 269/903; 439/331
[58] Field of Search ............ 324/158 F; 206/328, 206/329, 334; 361/212, 220; 439/69–73, 330, 331; 269/117, 903

[56] References Cited

U.S. PATENT DOCUMENTS

| | | | |
|---|---|---|---|
| 3,391,383 | 7/1968 | Antes | 339/17 CF |
| 3,652,974 | 3/1972 | Tems | 339/17 CF |
| 3,912,983 | 10/1975 | Lowry, Jr. | 339/17 CF |
| 4,437,718 | 3/1984 | Selinko | 339/17 CF |
| 4,513,353 | 4/1985 | Bakermans et al. | 339/17 CF |
| 4,535,887 | 8/1985 | Egawa | 206/328 |
| 4,564,880 | 1/1986 | Christ et al. | 361/212 |

Primary Examiner—Ernest F. Karlsen
Attorney, Agent, or Firm—Bruce J. Wolstoncroft

[57] ABSTRACT

A protective fixture for a flat chip carrier comprises a flat fixture body having a recess in one surface thereof which receives the body of the chip carrier so that the leads extending from the edges of the chip carrier project towards the edges of the fixture body. Tool clearance openings are provided which extend through the fixture body and are located between the chip carrier and the edges of the fixture body so that the leads extend into and partially across the clearance openings. The tool clearance openings permit the performance of various operations on the leads and on the integrated circuit such as trimming and forming of the leads and testing of the circuit in the chip carrier. The leads are fully protected and it is not necessary to remove the chip carrier from the fixture until it is assembled to a circuit board or the like.

15 Claims, 6 Drawing Sheets

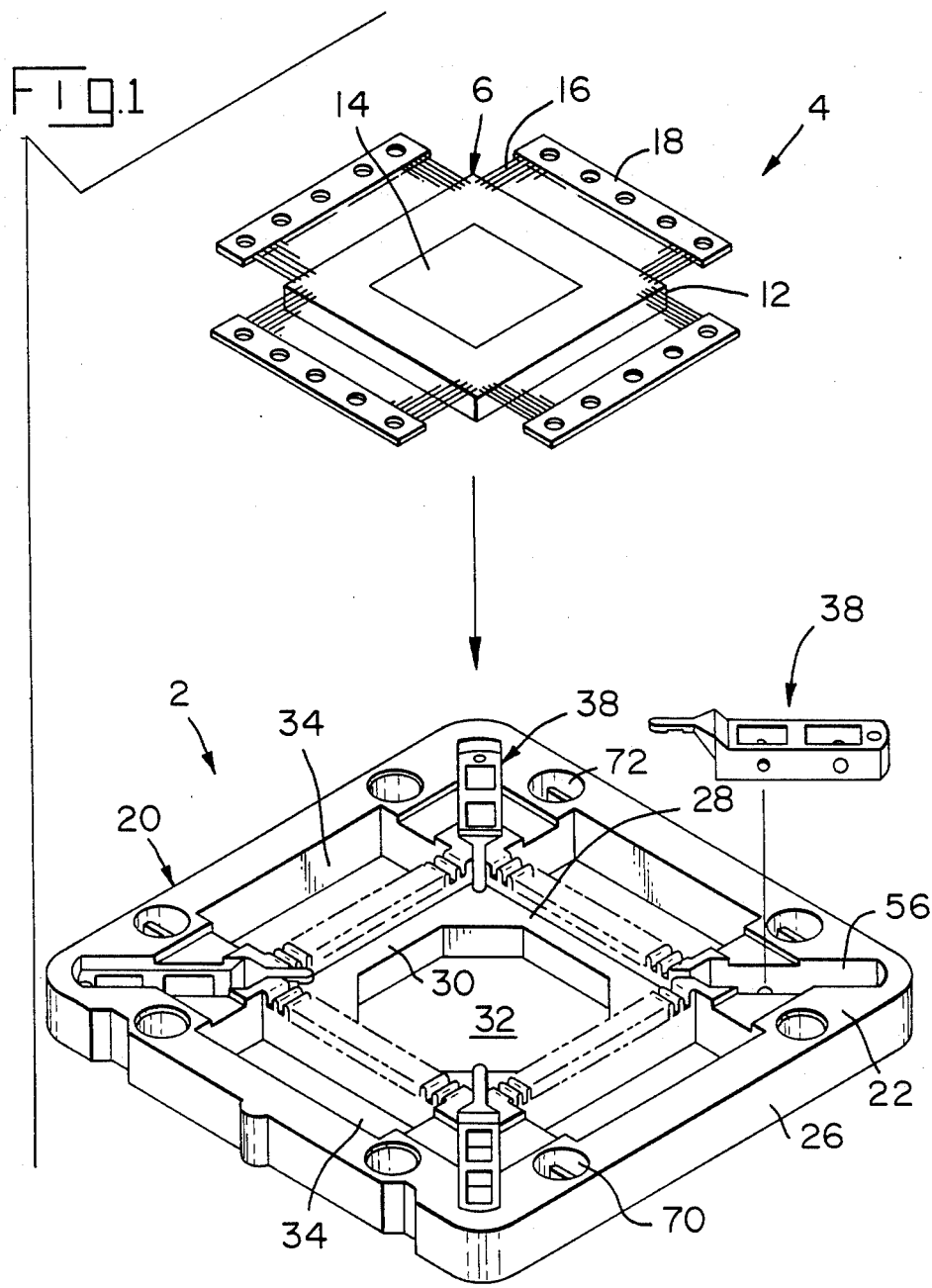

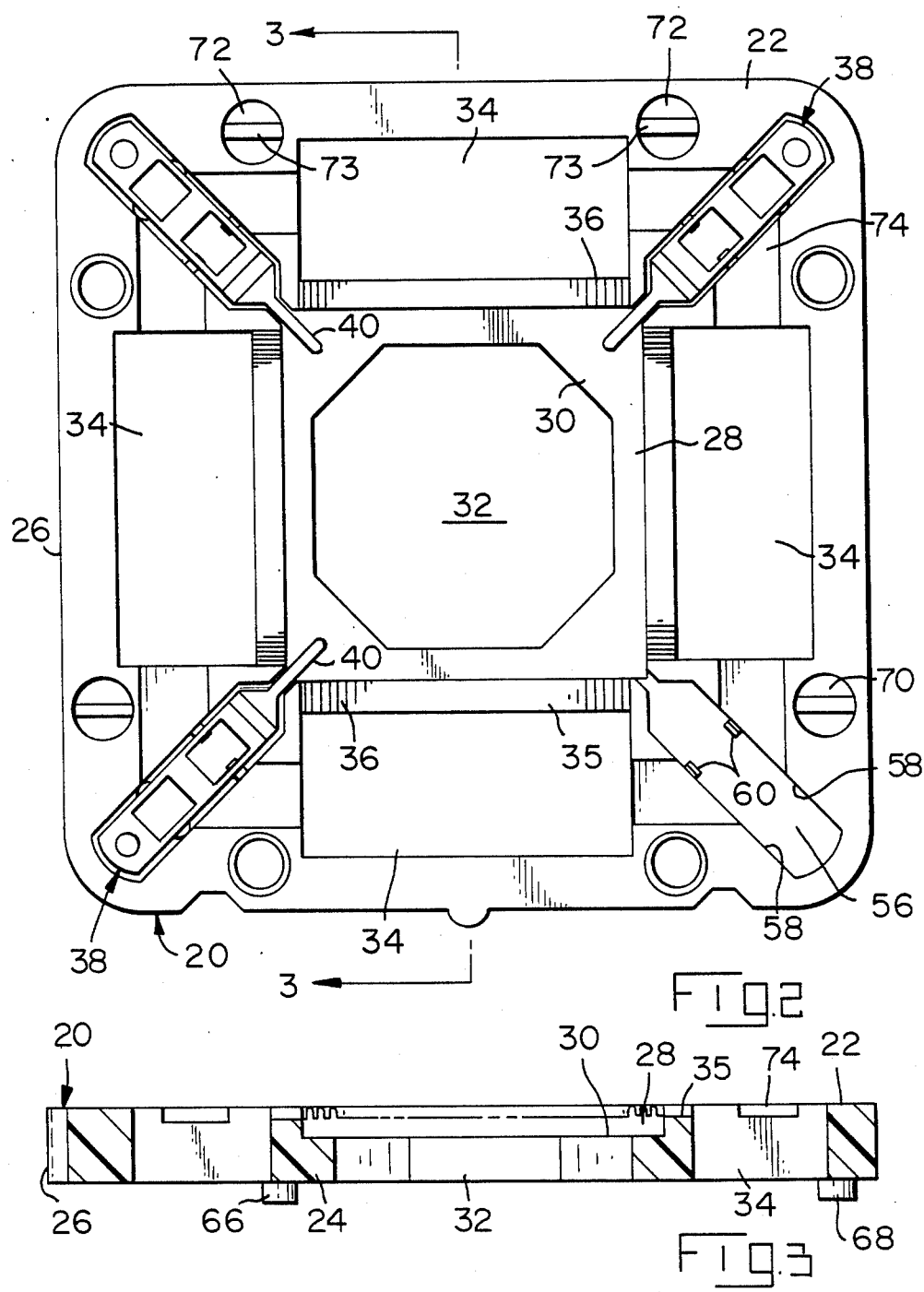

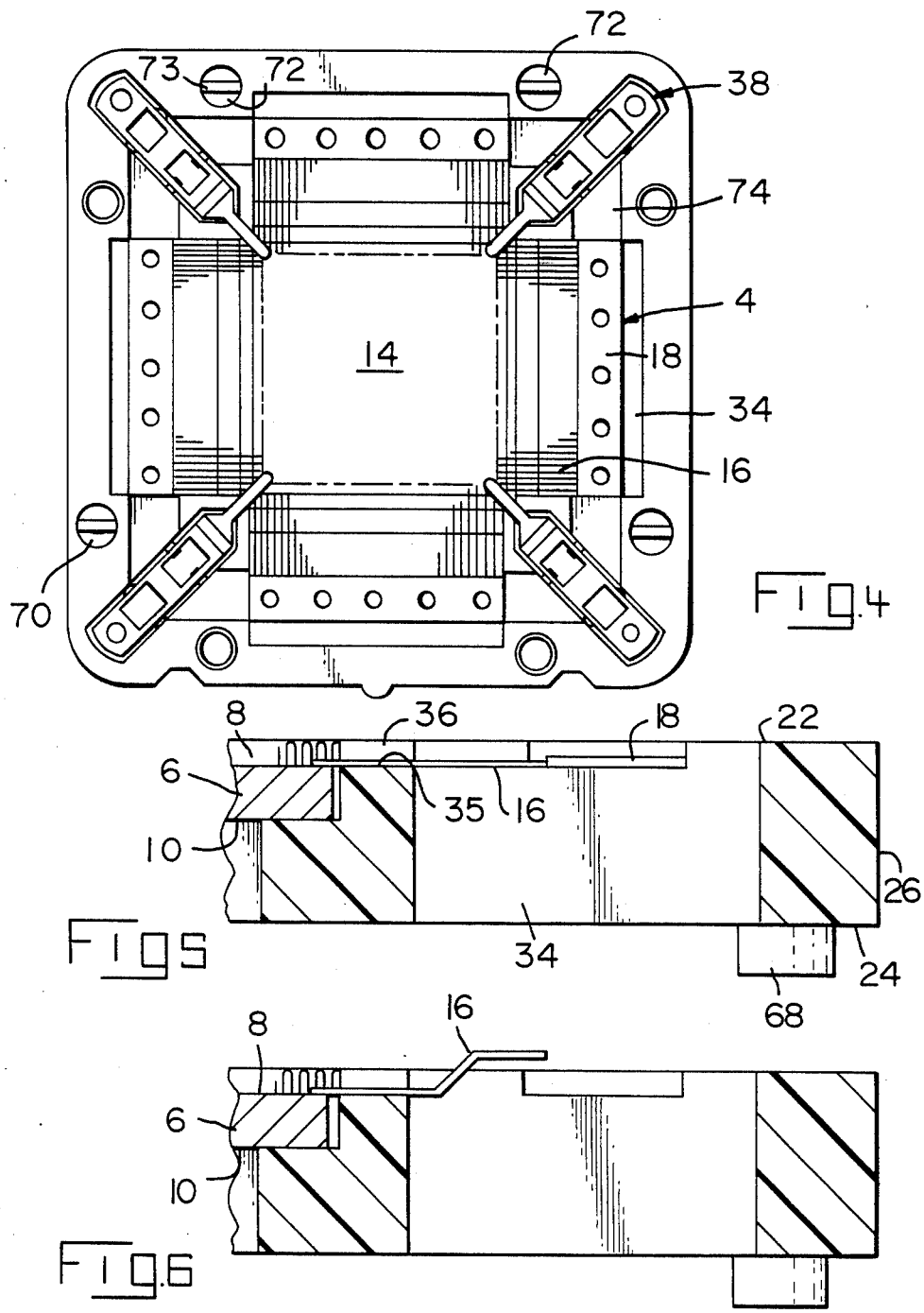

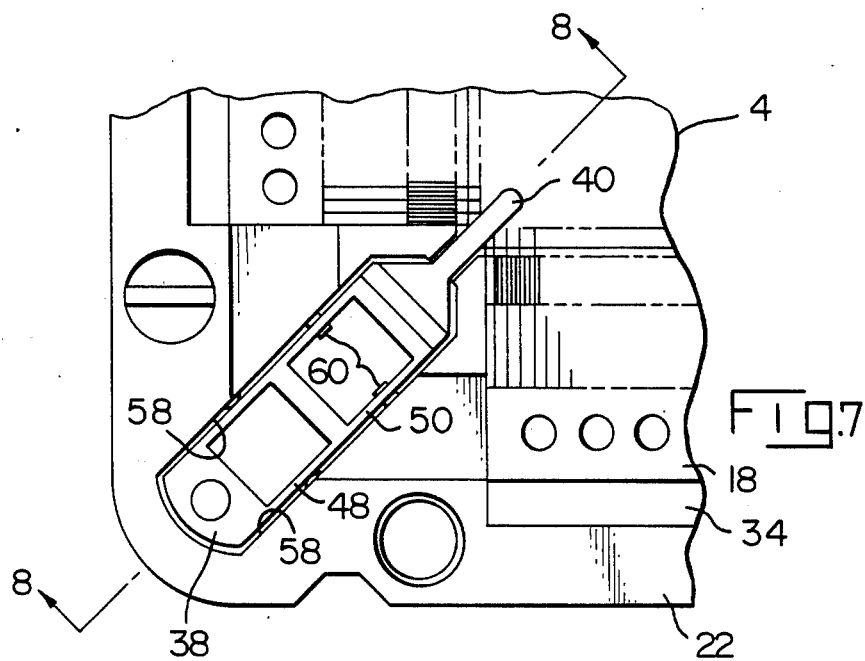
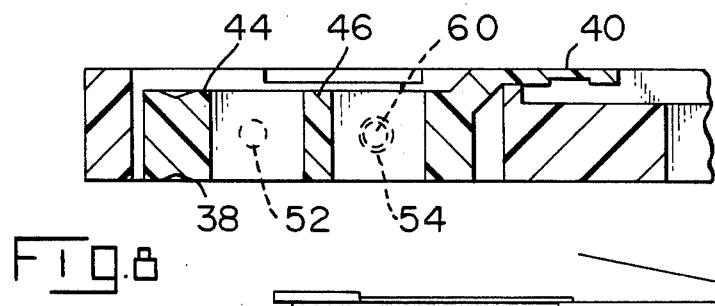
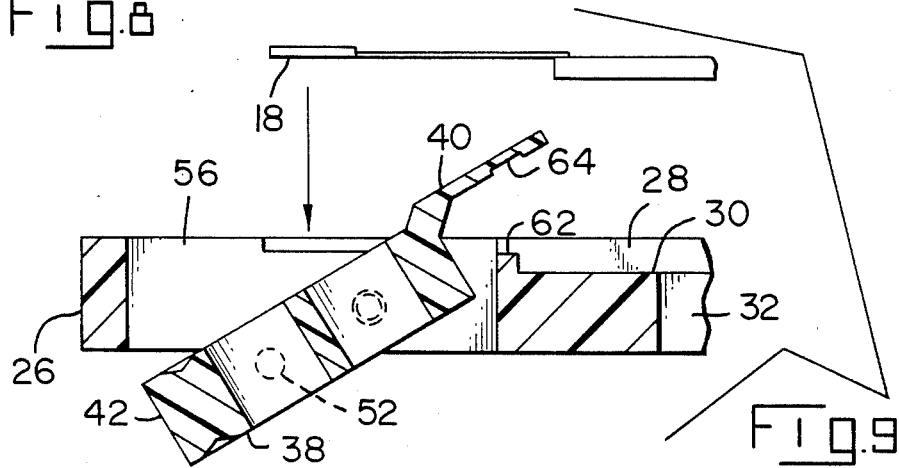

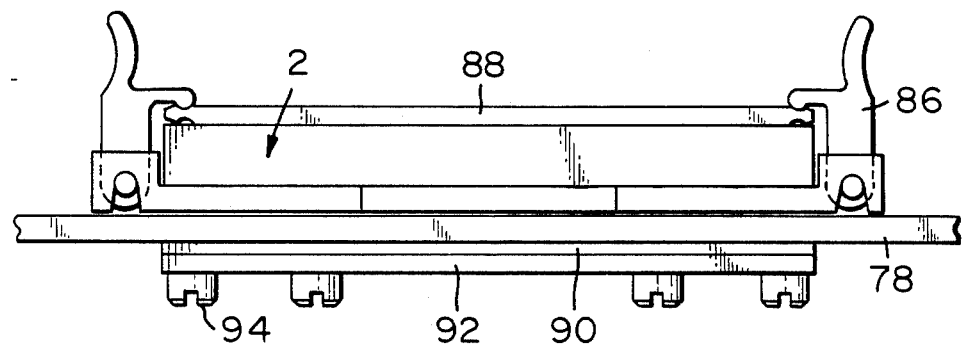
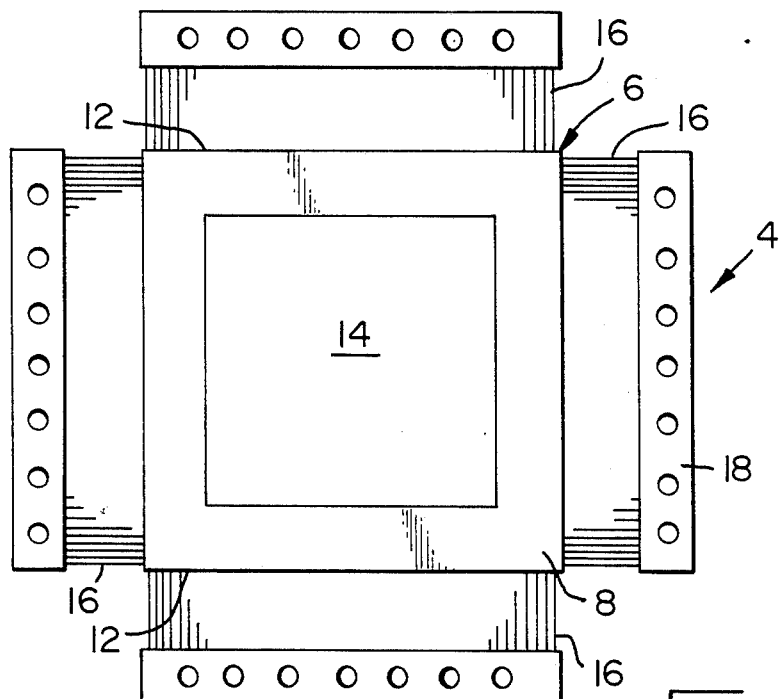

PROTECTIVE FIXTURE FOR CHIP CARRIER

This application is continuation of application Ser. No. 784,917 filed Oct. 4, 1985, now abandoned.

FIELD OF THE INVENTION

This invention relates to a fixture for a chip carrier and particularly to a fixture which serves as a protective package for the chip carrier while it is being tested and other operations are being performed prior to placement of the chip carrier on a circuit board.

BACKGROUND OF THE INVENTION

Integrated circuits are commonly mounted on supports or substrates which are referred to as chip carriers. Conductors on the chip carrier are connected to the integrated circuit and extend to the edges of the carrier. Sheet metal leads are connected to these conductors on the carrier and extend outwardly from the edges of the substrate. When the integrated circuit is placed in service, these leads in turn are soldered to terminal areas on a circuit board.

Prior to placement of an integrated circuit on a chip carrier in service, it is necessary to carry out several operations such as testing of the circuit, trimming of the leads extending from the chip carrier, and usually, forming or bending of these leads so that the chip carrier will be supported above the surface of the circuit board on which it is mounted. The leads are extremely delicate and these operations normally require repeated handling of the chip carrier, which handling must be done very carefully and which nonetheless may result in damage to the chip carrier. For example, in order to test the integrated circuit, it is necessary to place the chip carrier in a connector so that the leads can be temporarily connected to terminals in a complementary connector. The trimming and forming operations are carried out separately so that the chip carrier must be handled during all of these preliminary operations before the integrated circuit can be placed in service.

The present invention is directed to the achievement of a fixture into which a chip carrier can be placed at the time of manufacture and from which it need not be removed until the integrated circuit is actually placed in service. The invention is thus directed to the achievement of a fixture which will permit all of the operations required to be carried out on the chip carrier and on the leads thereof so that the fixture can serve also as a protective package for the chip carrier.

THE INVENTION

The invention comprises a protective fixture for a chip carrier, the chip carrier being of the type comprising a flat carrier body having oppositely facing major surfaces and circumferential carrier edge portions. Electrical leads extend from the carrier edge portions in side-by-side spaced-apart relationship so that these leads can be soldered to terminal areas when the chip carrier is placed in service. The protective fixture of the invention comprises a fixture body of insulating material having oppositely facing first and second major surfaces and circumferential fixture edge portions. A centrally located carrier mounting zone is provided on the first major surface and carrier locating means for locating the chip carrier body in the mounting zone are provided so that the electrical leads will extend towards the fixture edge portions. The protective fixture of the invention is characterized in that a plurality of tool clearance openings extend through the fixture body from the first major surface to the second major surface. The tool clearance openings are between the fixture body edge portions and the chip carrier edge portions of a chip carrier positioned in the carrier mounting zone. Lead supporting surfaces are thus provided between each of the tool clearance openings and the carrier mounting zone, these tool clearance openings being in surrounding relationship to the carrier mounting zone. A plurality of chip carrier clamps are provided for clamping a chip carrier in the mounting zone, the clamps being between adjacent tool clearance openings so that the leads extending from a chip carrier clamped in the carrier mounting zone will extend over the lead-supporting surfaces, towards the circumferential fixture edge portions, and at least partially across the tool clearance openings. These tool clearance openings permit operations such as lead trimming, lead forming, and testing to be carried out on the leads while the chip carrier is in the fixture.

Usually, the chip carrier body is rectangular or square and four tool clearance openings are provided in the fixture body, each clearance opening extending beside one of the sides of a chip carrier in the mounting zone. The carrier clamps are thus located adjacent to the corners of a chip carrier in the mounting zone. The locating means in the mounting zone preferably comprises a recess extending into the first major surface, and the depth of the recess is slightly greater than the thickness of the chip carrier body so that the carrier body is beneath the first major surface of the fixture body. With this arrangement, the leads will be between the first and second major surfaces of the fixture body and will thereby be protected.

In the preferred embodiment of the invention, aligning pins and recesses are provided in the first and second major surfaces so that the protective fixture of the invention can be stacked with a plurality of identical fixtures. This arrangement is particularly advantageous where robotics are used in any of the procedures carried out while the chip carrier is in the fixture.

THE DRAWING FIGURES

FIG. 1 is a perspective view of a fixture in accordance with the invention with a chip carrier exploded from the mounting zone of the fixture.

FIG. 2 is a plan view of the fixture with one of the carrier clamps removed.

FIG. 3 is a view looking in the direction of the arrows 3—3 of FIG. 2.

FIG. 4 is a view similar to FIG. 2 but showing a chip carrier in position on the fixture.

FIG. 5 is a fragmentary view similar to FIG. 3 but with the chip carrier in the fixture.

FIG. 6 is a view similar to FIG. 5 but showing the chip carrier leads after they have been trimmed and formed.

FIG. 7 is an enlarged plan view of one corner of the fixture showing details of the chip carrier clamps.

FIG. 8 is a view looking in the direction of the arrows 8—8 of FIG. 7.

FIG. 9 is a view similar to FIG. 8 which illustrates the pivoting movement of one of the clamps.

FIG. 12 is a side view showing a fixture in accordance with the invention coupled to a test connector as shown in FIG. 11.

FIG. 13 is a view of a chip carrier.

THE DISCLOSED EMBODIMENT

Figure 10:
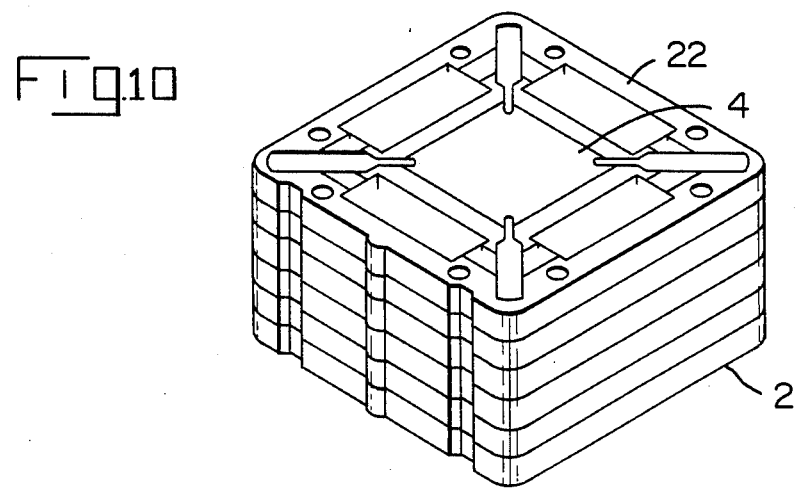
FIG. 10 is a view showing a stack of fixtures in accordance with the invention.

A fixture 2 in accordance with the invention, FIGS. 1-3, is dimensioned to receive a chip carrier 4 of the type shown in detail in FIG. 13. The chip carrier comprises a square chip carrier body 6 of ceramic or other insulating material having oppositely facing major surfaces 8, 10 and peripheral edge portions 12. The integrated circuit is commonly mounted in an area 14 on one of the major surfaces 8 and is usually potted with a suitable potting compound. Conductors extend from the integrated circuit across the chip carrier body to the peripheral edges 12 and are bonded to thin sheet metal leads 16 which extend from the peripheral edges. In the chip carrier 4 shown, the ends of these leads are integral with carrier strips 18. The carrier strips must be removed before the integrated circuit can be tested and the leads must also be bent as will be described below prior to mounting the chip carrier on a circuit board. It should be mentioned that in some instances, the carrier strips 18 will extend in each direction beyond the leads and be joined to the carrier strips extending from adjacent sides. In other words, a continuous carrier strip may extend continuously around the chip carrier body as will be explained below.

Chip carrier bodies of the type shown in FIG. 13 may have a length on each side of about 39 mm (1.53 inches) and the center-to-center spacing of adjacent leads is commonly about 0.6 mm (0.025 inches). As mentioned previously, the material of the leads 16 is very thin and they are, therefore, quite delicate.

The fixture 2 comprises a fixture body 20 of insulating material such as thermoplastic material, having first and second oppositely facing major surfaces 22, 24 and a circumferential fixture edge 26. A square recess 28 extends into the first major surface and conforms to the shape and dimensions of the chip carrier body. The recess serves as a locating means for locating the carrier body centrally in a mounting area. Preferably, the recess 28 is deeper than the thickness of the carrier body so that the carrier body will be beneath the first major surface as shown in FIG. 5. The carrier body is supported on the inner surface 30 of the recess and a central opening 32 is provided to permit removal of the chip carrier from the fixture.

Rectangular tool clearance openings 34 are provided in surrounding relationship to the recess and extend parallel to the edges 26 for a distance equal to the distance between the end leads 16 on each edge 12 of the carrier body 6. These openings 34 are between the peripheral edge portions 12 of a chip carrier body 6 contained in the recess 28 and the peripheral edge portions 26 of the fixture body so that lead-supporting surfaces 35 are provided between the recess and the openings 34. These lead-supporting surfaces are slightly beneath the plane of the first major surface of the fixture body and are provided with side-by-side lead-receiving channels 36, FIG. 5, so that the leads will be precisely positioned. As shown in FIG. 4, the leads will extend towards the circumferential edges 26 and partially into the openings 34 but will be between the planes of the first and second major surfaces 22, 24 and will thereby be protected.

The chip carrier body 6 is clamped to the fixture by means of four clamps 38, FIG. 7, which are located at the corners of the recess 28 as shown in FIG. 2. Each clamp has a clamping arm 40 which extends over the surface of the chip carrier body and a mounting arm 42 which is received in a clamp-mounting opening 56. The upper surface 44 of the mounting arm is below the plane of the first major surface 22 as shown in FIG. 8 when the clamp is in its normal position for reasons which will be discussed below. The mounting arm is generally rectangular and is hollow with a centrally located rib 46 extending beneath its two parallel sidewalls. This rib divides the sidewalls into two deformable wall portions 48, 50. Bosses 52 are provided on the wall portion 48 and aligned holes 54 are provided on the wall portion 50.

The clamp-mounting openings 56 each have opposed internal walls 58 and trunnions 60 are provided on the walls 58 and are dimensioned to be received in the holes 54 of the mounting arm. The clamps are thus assembled to the fixture body by merely moving them into the clamp-mounting openings 56. As the wall portions 50 move pass the trunnions, these wall portions will deflect slightly until the trunnions enter the holes 54. The bosses 52 bear resiliently against the internal walls 58 so that when the clamp is in the position of FIG. 8, it cannot be moved from that position without overcoming the frictional forces. The bosses thus serve as a detent device to maintain the mounting arms in the position of FIG. 8 although the arms can be pivoted to the positions of FIG. 9 in order to remove a chip carrier from the mounting zone.

A shallow channel 62, FIG. 9, extends from each of the openings 56 to the central recess for reception of the clamping arm 40. By virtue of this feature and the dimensions of the clamping arm, the upper surface of the clamping arm 40 is coplanar with the first major surface 22 of the fixture body. The underside of the clamping arm 40 has a recess 64 so that it will not engage any portions of leads 16 extending from a chip carrier in the mounting zone.

Aligning bosses 66, 68 extend from the second major surface 24 of the fixture body and complementary openings 70, 72 extend into the first major surface. These bosses and openings are not symmetrical with respect to the center of the fixture so that when two or more fixtures are stacked, they will all be in the same orientation. This feature is of significance when fixtures in accordance with the invention are used in conjunction with robotic testing and assembly techniques as will be described below. The openings 70, 72 all have transverse ribs 73 extending thereacross which permit the bosses 66, 68 to enter the openings but which function as stops when the fixture is coupled to a test connector or fixture as will also be described below.

Figure 11:
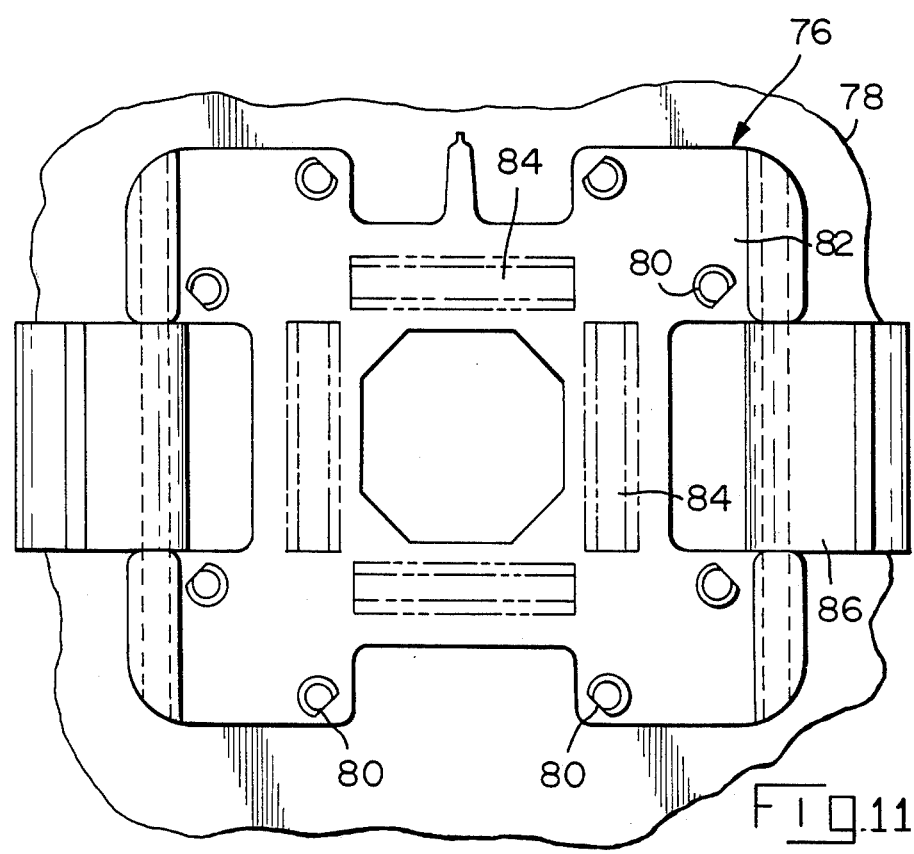
FIG. 11 is a plan view of a test connector.

FIG. 11 shows a test connector or test fixture 76 mounted on a circuit board 78 by fasteners 94 and which is capable of receiving a fixture 2 in accordance with the invention as shown in FIG. 12. The test fixture 76 has pins 80 which enter the openings 70, 72 so that the leads 16 will be properly positioned for engagement with contact terminals arranged in rows 84 in the test fixture 76.

In order to test a chip carrier contained in a fixture 2, the fixture is positioned on the upper surface 82 of the text fixture and a clamping plate 88 is positioned on top of the fixture 2. Thereafter the fixture 2 is clamped against the connector 76 by means of clamps 86 on the test fixture 76. In the test arrangement shown in FIG. 12, a clamping plate 92 is also provided on the underside of the circuit board 78 and separated from the surface of the circuit board by an insulating plate 90. As mentioned previously, in some chip carriers, the carrier strips 18 extend laterally beyond the rows of leads 16 and are joined to each other to provide a protective frame of continuous carrier strip around all of the leads 16. If the chip carrier is of this type, the extensions of the carrier strips 18 are received in shallow channels 74 which extend from each of the tool clearance openings 34 to the openings 56. The corners of this continuous carrier strip would then extend over the recessed upper surface 46 of the mounting handle of each clamp. As will be apparent from FIG. 9, pivoting of the clamp would not interfere with this carrier strip extending around the corners of the fixture body.

It will be apparent from the foregoing description that a fixture in accordance with the present invention serves not only as a connector for connecting the leads extending from the chip carrier to the terminals in a test fixture as shown in FIG. 11, but actually serves as a packaging technique for the chip carrier which is compatible with operations which must be performed on the chip carrier prior to its being placed in service. Fixtures in accordance with the invention can thus be supplied to the manufacturer of the integrated circuit as shown in FIG. 13 who would place each chip carrier 4 in a fixture 2. The fixture 2 would be used as a protector for the chip carrier during shipping or handling while the leads were being trimmed and formed and while the testing operation was being carried out. The tested integrated circuit on the chip carrier would not be removed from the fixture at this time but would then be sent on to the station at which it is placed on a circuit board. The stackability of fixtures in accordance with the invention (FIG. 10) is particularly advantageous in that an entire shipment of integrated circuits can be stacked together and carried through all of the operations required, trimming, forming, and testing by robotic techniques since a robotic apparatus could be used with a stack of fixtures. Even the final assembly of the chip carrier to a circuit board could be carried out by a robotic apparatus working with a stack of fixtures in accordance with the invention.

I claim:

1. A protective fixture for a chip carrier, the chip carrier being of the type comprising a flat carrier body having oppositely facing major surfaces and circumferential carrier edge portions, electrical leads extending from the carrier edge portions in side-by-side spaced-apart relationship, the protective fixture comprising a fixture body of insulating material having oppositely facing first and second major surfaces and circumferential fixture edge portions, a centrally located carrier mounting zone on the first major surface, carrier locating means for locating the carrier body in the mounting zone with the electrical leads extending towards the fixture edge portions, the protective fixture being characterized in that:

a plurality of tool clearance openings extend through the fixture body from the first major surface to the second major surface, the tool clearance openings being between the fixture edge portions and the carrier edge portions of a chip carrier positioned in the carrier mounting zone, the tool clearance openings being in surrounding relationship to the carrier mounting zone, and chip carrier retention means are provided for clamping a chip carrier in the carrier mounting zone to the fixture, the carrier retention means being between adjacent tool clearance openings such that each chip carrier retention means cooperates with a respective corner of the chip carrier, each chip carrier retention means having an end portion which is movable from a first position to a second position, the second position being defined such that the end of the chip carrier retention means is not positioned in the mounting zone, thereby allowing the chip carrier to be positioned in the carrier mounting zone under zero insertion force conditions, the first position being such that the respective ends of the carrier retention means are positioned in the carrier mounting zone in engagement with the chip carrier when the chip carrier is inserted therein, so that the chip carrier is maintained in the mounting zone of the fixture whereby, the leads extending from a chip carrier clamped in the carrier mounting zone will extend over the lead-supporting surfaces, towards the circumferential fixture edge portions and at least partially across the tool clearance openings so that operations, such as lead trimming and lead forming operations, can be performed on the leads and the fixture can be used as a connector for connecting the leads to terminals in a testing apparatus.

2. A protective fixture as set forth in claim 1 characterized in that the carrier body is rectangular, the fixture body having four tool clearance openings therein, each of the tool clearance openings extending beside one of the sides of a chip carrier in the mounting zone, the chip carrier clamps being located adjacent to the corners of a chip carrier in the mounting zone.

3. A protective fixture as set forth in claim 2 characterized in that the carrier locating means comprises a recess extending into the first major surface, the recess conforming to the shape of the carrier body.

4. A protective fixture as set forth in claim 2 characterized in that each of the clamps has a clamping arm which extends from the first major surface past one corner of a chip carrier in the mounting zone and over one surface of the carrier body.

5. A protective fixture as set forth in claim 4 characterized in that the carrier locating means comprises a recess extending into the first major surface of the fixture body, the recess conforming to the shape of the carrier body and having a depth which is at least equal to the thickness of the carrier body.

6. A protective fixture as set forth in claim 5 characterized in that the recess has a depth which is greater than the thickness of the carrier body, whereby upon placement of a chip carrier in the mounting zone, one surface of the carrier body will be parallel to, and recessed from, the first major surface of the fixture body, and the leads in the tool clearance openings will be between the planes of the first and second major surfaces of the carrier body and will be contained within the tool clearance openings and thereby protected.

7. A protective fixture as set forth in claim 6 characterized in that arm-receiving recesses are provided in the first major surface, the clamping arms being received in the recesses whereby the clamping arms do not project beyond the plane of the first major surface of the fixture body.

8. A protective fixture as set forth in either of claims 4 or 7 characterized in that each of the chip carrier clamps has a mounting arm extending from the clamping arm, the fixture body having clamp-mounting openings extending inwardly from the first major surface adjacent to the corners of a carrier body in the mounting zone, the mounting arms being received in the clamp-mounting openings.

9. A protective fixture as set forth in claim 8 characterized in that the mounting arms are pivotally mounted in the clamp-mounting openings whereby the clamping arms can be moved arcuately away from the mounting zone to permit a chip carrier to be placed in, or removed from, the mounting zone.

10. A protective fixture as set forth in claim 9 characterized in that each of the mounting arms is hollow and has deformable mounting arm wall portions which are opposed to wall portions of the clamp-mounting opening, the mounting arms being pivotally mounted in the clamp-mounting openings by means of integral trunnions on the wall portions of the clamp-mounting openings and holes in the deformable wall portions into which the trunnions extend.

11. A protective fixture as set forth in claim 10 characterized in that projecting bosses are provided on the deformable wall portions of the mounting arms, the bosses being resiliently held against the wall portions of the clamp-mounting openings whereby detents are provided for the mounting arms.

12. A protective fixture as set forth in claim 8 characterized in that carrier strip channels extend from each of the tool clearance openings to the clamp-mounting openings for the accommodation of extensions of carrier strips on the ends of the electrical leads.

13. A protective fixture as set forth in either of claims 1 or 7 characterized in that interengageable aligning means are provided on the first and second major surfaces so that the protective fixture and a plurality of identical fixtures can be stacked on top of each other in aligned relationship, and the uppermost fixture on the stack can be removed by lifting from the stack.

14. A protective fixture as set forth in claim 13 characterized in that the aligning means comprised aligning bosses and recesses dimensioned to receive the bosses.

15. A protective fixture as set forth in claim 1 characterized in that the chip carrier retention means is a plurality of clamps.

* * * * *